United States Patent [19]

Cooke

[11] Patent Number: 4,924,190

[45] Date of Patent: May 8, 1990

[54] AMPLIFIERS

[75] Inventor: Michael P. Cooke, Wiltshire, Great Britain

[73] Assignee: Plessey Overseas Limited, Essex, England

[21] Appl. No.: 222,421

[22] Filed: Jul. 21, 1988

[30] Foreign Application Priority Data

Jul. 21, 1987 [GB] United Kingdom ............... 8717152

[51] Int. Cl.$^5$ .......................... H03F 1/36; H03G 3/20
[52] U.S. Cl. ....................................... 330/86; 330/140
[58] Field of Search .................. 330/51, 86, 129, 140, 330/254, 278, 291; 307/494

[56] References Cited

U.S. PATENT DOCUMENTS 3,671,886  6/1972  Fudemoto et al. ................ 330/140
4,639,047  1/1987  Imanaka ............................ 330/86 X
4,755,771  7/1988  Sakaida et al. ................... 330/86 X

FOREIGN PATENT DOCUMENTS 0012709  6/1980  European Pat. Off. .
 657124  9/1951  United Kingdom .
1118790  7/1968  United Kingdom .
1251755 10/1971  United Kingdom .
1299055 12/1972  United Kingdom .
1322219  7/1973  United Kingdom .
1342383  1/1974  United Kingdom .
1427799  3/1976  United Kingdom .
1513126  6/1978  United Kingdom .

Primary Examiner—Steven Mottola
Attorney, Agent, or Firm—Fleit, Jacobson, Cohn, Price, Holman & Stern

[57] ABSTRACT

The invention provides an amplifier having a feed-back path into which either of two different value resistances may be switched in dependance upon the level of the amplifier output.

3 Claims, 2 Drawing Sheets

RF1 >> RF2

AMPLIFIERS

This invention relates to amplifiers having feed-back arrangements and is particularly, but not exclusively, concerned with transimpedance amplifiers.

Amplifiers are limited in their dynamic range. The dynamic range of an amplifier, as used herein, is the ratio of the maximum input signal to the equivalent input noise and, in turn, the maximum input signal of an amplifier, as used herein, is that input signal at which the amplifier's gain is reduced by one decibel (1 dB). The maximum input signal is sometimes known as "the 1 dB compression point".

The aforesaid limitation of the dynamic range of an amplifier is therefore effectively limited by noise performance and, in practice, the 1 dB compression point cannot be increased without an undue increase in noise.

In general purpose fibre optic links, laser optical transmitters are beginning to replace light emitting diodes. Such lasers generate far more power than the diodes and are extremely advantageous at medium to high link lengths. However, if the link length is short, an optical receiver of such link has to cope with signals of considerably increased power. It would be advantageous to provide an amplifier, the dynamic range of which is such as to be able to cope with the wide range of signal strengths occasioned by greatly varying optical link lengths.

It is an object of the present invention to provide an amplifier with means for extending the dynamic range thereof without excessive increase in noise.

According to the present invention, there is provided an amplifier having a feed-back path, a variable resistance in the feed-back path, and means for varying the value of the variable resistance in accordance with the output of the amplifier to increase the dynamic range of the amplifier.

The invention will be described further, by way of example, with reference to the accompanying drawings in which.

Figure 1:
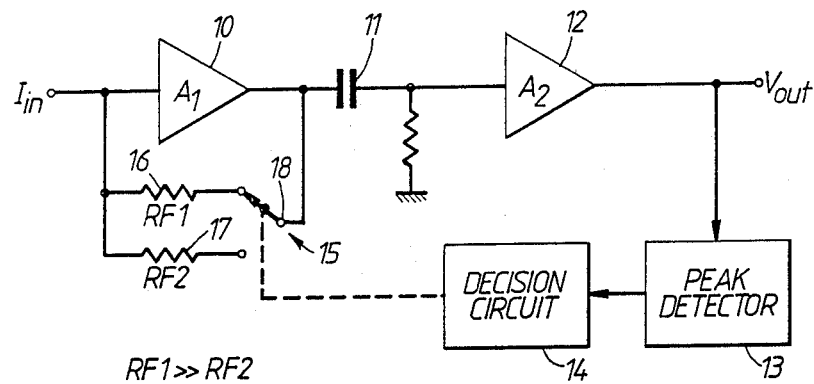
FIG. 1 is a simplified block diagram of a transimpedance amplifier constructed in accordance with the present invention.

Referring to the drawings, a transimpedance amplifier constructed in accordance with the present invention comprises a first amplifier 10 to which a detected signal is input. The output of the first amplifier 10 is a.c. coupled through a capacitor 11 to a second amplifier 12. The output of the amplifier 12 is fed to a peak detector 13 arranged to operate a decision circuit 14 which, in turn controls a resistive feed-back arrangement 15 of the first amplifier 10.

The feed-back arrangement 15 comprises a plurality of resistors 16, 17 which may be selectively switched into the feed-back path by switch means 18 controlled by the decision circuit 14.

In operation, as $I_{in}$, the incoming signal increases, the gain of the amplifier 10 defined by the resistor 16, is held constant within the dynamic range of the amplifier 10. However, the signal out of the amplifier 12 is a voltage Vout which rises in dependence upon the input current.

At a predetermined value of Vout, corresponding to a desired upper limit of the dynamic range of the amplifier 10, the peak detector 13 signals to the decision circuit 14 to change state and to switch in the resistor 17 having a lower resistance than the resistor 16 whereby to increase the feed-back. The dynamic range of the amplifier 10 assumes new values. The operation is illustrated graphically in FIGS. 2a and 2b.

Figure 3:
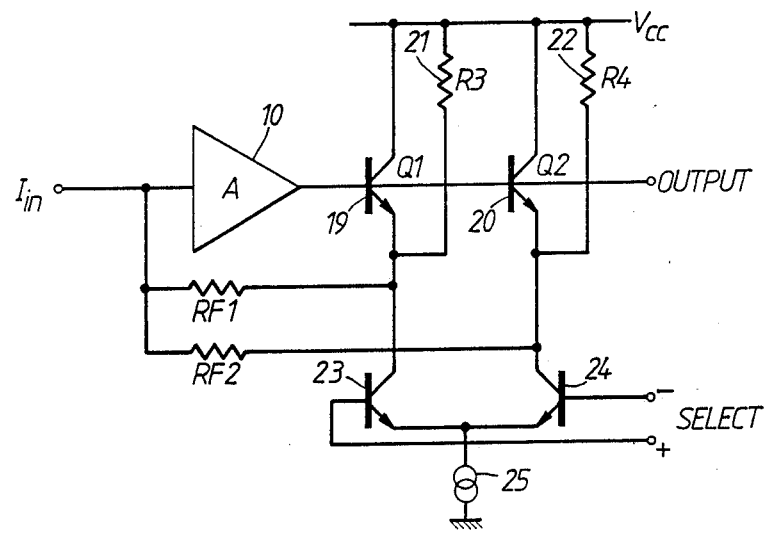
FIG. 3 is a schematic circuit diagram of a part of the amplifier of FIG. 1.

FIG. 3 illustrates in more detail the amplifier 10 and its associated switchable feed-back arrangement. Signals output by the amplifier 10 turn on load transistors 19, 20 each parallelled by a respective resistor 21, 22 to provide two feed-back paths through respective transistors 23, 24 to a current sink 25. The transistors 23, 24 are turned on and off by complementary signals on their bases from the decision circuit 14. Depending on which of the transistors 23, 24 is turned on, a feed-back path through transistor 19 and feed-back resistor 16 (if the transistor 23 is switched on) or through the transistor 20 and the resistor 17 (if the transistor 24 is turned on) is provided for the amplifier 10. An appropriate output is thus provided, via the capacitors 11 to the amplifier 12.

Figure 4:
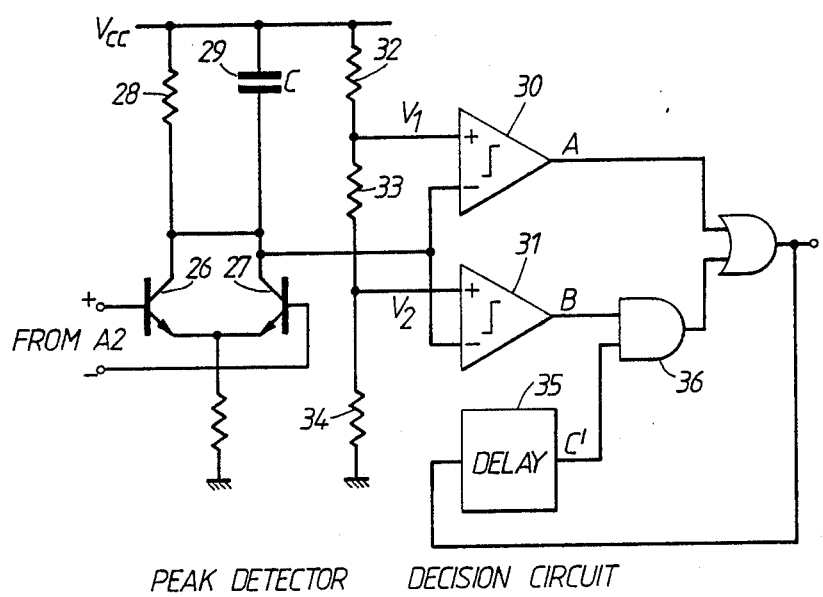
FIG. 4 is a schematic circuit diagram of a peak detector and decision circuit of the amplifier of FIG. 1.

The output of the amplifier 12 is fed to the peak detector circuit of FIG. 4. The amplifier output is differentially coupled to the bases of a long-tailed pair of transistors 26, 27, having crosscoupled collectors having a common collector load defined by a resistor 28 and a capacitor 29. As the output of the amplifier 12 swings (rises negatively or positively) beyond preset limits, one of the transistors 26, 27 will be turned on changing the state of the decision circuit 14. The transistors 26, 27 provide a corresponding signal to the negative inputs of two differential amplifiers 30 and 31 each having an appropriate reference voltage applied to its positive input. The reference voltages are defined by a potential divider comprising resistors 32, 33 and 34.

The amplifier 30 is arranged to have an output A and the amplifier 31 has an output B.

A delay unit 35 provides an output $C^1$ where $C^1$ is the previous state of the decision circuit 14.

Delay unit 35 output $C^1$ is "ANDed" with the B output of the differential amplifier 31 in an AND gate 36, the output of which is "ORred" with the A output of the differential amplifier 30 in an OR gate 37 to provide an output C.

Referring again to FIG. 1, the resistors 16 and 17 constitute feed-back resistors RF1, and RF2 of the transimpedance amplifier where $RF_1 << RF_2$.

The amplifiers equivalent input noise current is given by:

$$\overline{i_{ni}^2} = \overline{i_{na}^2} + 4kT \cdot 1/RF \cdot \Delta F \qquad (1)$$

where $i_{ni}$ is the total equivalent input current noise;

$i_{na}$ is the current noise of the gain block;

k is Boltzmann's constant;

RF is the value of the feedback resistor,

T is the absolute temperature; and $\Delta F$ is the bandwidth of the amplifier.

To minimise the effect of the amplifier's equivalent input current noise, equation (1) shows that the feedback resistor RF should be as large as possible. When the input signal is low (and noise has its greatest effect) and the maximum sensitivity is required, the decision circuit 14 should select RF1, (resistor 16). However, when the input signal is large (so that noise is much less of a problem) and sensitivity is of secondary consequence, the decision circuit 14 is arranged to select RF$_2$ (resistor 17).

The amplifier 10 is thereby prevented from overloading. The dynamic range of the amplifier 10 is thereby extended (and could be extended further by the use of a greater selection of feed-back resistors with an appropriate decision circuit for selecting the most suitable resistor or resistor combination).

Figure 2A:
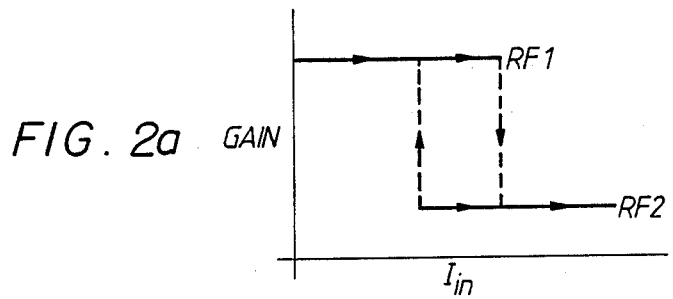
FIGS. 2a and 2b are graphical representations of the relationships appertaining in the amplifier of FIG. 1.
Figure 2B:
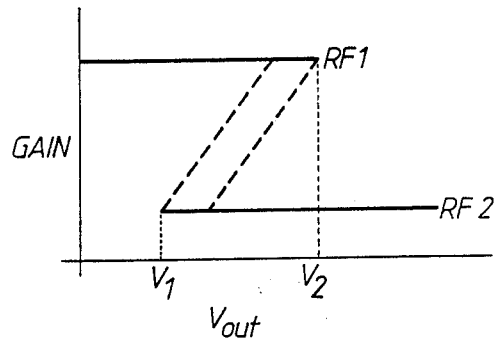

The change in gain with input level is illustrated in FIG. 2a. Hysterysis is provided between the switching points to prevent random noise upsetting the decision circuit. As above described, the decision circuit operates on the value of Vout of the amplifier, rather than the input signal to the amplifier. The characteristic is illustrated in FIG. 2b.

The characteristic can be expressed logically given
(a) if Vout V$_1$ then A=1
(b) if Vout V$_2$ then B=1
(c) if RF=RF$_1$ then C=1
that is:

$$C = A + BC^1 \qquad (2)$$

In this equation C gives the new state of RF and C$^1$ represents the previous state of RF.

The invention is not confined to the precise details of the foregoing example and variations may be made thereto. For example, and as mentioned above, more than two selectable resistors may be provided in the feed-back path. Further, any variable resistive feed-back element may be used to control the feed-back and thereby alter the gain of the amplifier. Other forms of peak detection and decision circuits may be employed to provide the desired change in the resistance of the feed-back path.

The invention is applicable to any active device having a feed-back path and is not limited to transimpedance amplifiers. As only resistors and NPN transistors are used in the described application, the transimpedance amplifier, according to the present invention, may be fabricated readily in an integrated circuit device.

I claim:

1. An amplifier having a feed-back path, a variable resistance in the feed-back path, and means for varying the value of the variable resistance in accordance with an output of the amplifier to increase the dynamic range of the amplifier, wherein the variable resistance comprises a plurality of resistors, and the means for varying the resistance is arranged to detect the magnitude of the output of the amplifier and to select the appropriate resistor or resistors for inclusion into the feed-back path, said means for varying the resistance comprising a peak detector and a decision circuit, with the peak detector being arranged to monitor the output of the amplifier, and said decision circuit comprising a logic circuit, the plurality of resistors comprising a first resistor switched into the feed-back path on a logic '1' output of the decision circuit and a second resistor switched into the feed-back path in response to a logic '0' output of the decision circuit.

2. An amplifier as claimed in claim 1 wherein the logic circuit performs the logical expression:

$$C = A + B.C^1$$

where C is the logical output of the circuit, C$^1$ is the previous logical output of the circuit, A is a logic '1' when the voltage out is less than or equal to a first predetermined voltage, B is a logic '1' when the voltage out of the amplifier is greater than or equal to a second predetermined voltage and when C is a logic '1', the higher value resistance of the first and second resistors is included in the feed-back path.

3. An amplifier as claimed in claim 4 wherein the amplifier is in the form of a two stage transimpedance amplifier.

* * * * *